United States Patent
Lee et al.

(10) Patent No.: US 11,150,330 B2
(45) Date of Patent: Oct. 19, 2021

(54) BEAM PROJECTOR MODULE FOR SLIDING INSERTION OF AN OPTICAL DEVICE

(71) Applicant: Namuga, Co., Ltd., Gyeonggi-do (KR)

(72) Inventors: Jun Youb Lee, Gyeonggi-do (KR); Young Gyu Kang, Gyeonggi-do (KR); Jeong Hwa Seo, Gyeonggi-do (KR)

(73) Assignee: NAMUGA, CO., LTD, Gyeonggi-do (KR)

( * ) Notice: Subject to any disclaimer, the term of this patent is extended or adjusted under 35 U.S.C. 154(b) by 114 days.

(21) Appl. No.: 16/573,229

(22) Filed: Sep. 17, 2019

(65) Prior Publication Data
US 2020/0089094 A1 Mar. 19, 2020

(30) Foreign Application Priority Data

Sep. 18, 2018 (KR) .................. 10-2018-0111279
Aug. 26, 2019 (KR) .................. 10-2019-0104395

(51) Int. Cl.

| | | |
|---|---|---|
| *H01S 5/00* | (2006.01) | |
| *G02B 7/00* | (2021.01) | |
| *G01S 7/481* | (2006.01) | |
| *G03B 21/20* | (2006.01) | |
| *G02B 27/18* | (2006.01) | |
| *H01S 3/10* | (2006.01) | |

(52) U.S. Cl.
CPC ............ *G01S 7/4814* (2013.01); *G02B 27/18* (2013.01); *G03B 21/2033* (2013.01); *H01S 3/10* (2013.01); *H01S 5/005* (2013.01)

(58) Field of Classification Search
CPC . H01S 3/10; H01S 3/183; H01S 5/022; H01S 5/02253; H01S 5/023; H01S 5/005; H01S 5/02257; H01S 7/003; H01S 5/02208; H01S 5/183; G03B 21/2033; G03B 27/18; G01S 7/4814; G01S 7/497
See application file for complete search history.

(56) References Cited

U.S. PATENT DOCUMENTS

| | | | |
|---|---|---|---|
| 10,174,931 B2 | 1/2019 | Sawyer et al. | |
| 2003/0066955 A1 | 4/2003 | Schaub et al. | |
| 2019/0081187 A1 | 3/2019 | Balimann et al. | |
| 2019/0131767 A1 | 5/2019 | Lee et al. | |
| 2019/0379173 A1* | 12/2019 | Coffy | ...................... H01S 3/025 |

FOREIGN PATENT DOCUMENTS

| | | |
|---|---|---|
| JP | 2012-029141 A | 2/2012 |
| KR | 10-1853268 B1 | 5/2018 |

* cited by examiner

*Primary Examiner* — Xinning(Tom) Niu
(74) *Attorney, Agent, or Firm* — FisherBroyles, LLP; Susan M. Oiler

(57) ABSTRACT

A beam projector module including a light source configured to output light, a substrate configured to support the light source, an optical device configured to decrease the intensity of the light output to a predetermined space, an optical substrate, in which the optical device is disposed, and configured to transmit the light, and a frame configured to space the optical device apart from the light source by a predetermined distance, and including a support part configured to support the optical substrate, wherein the optical substrate is slidingly inserted through a first slot formed to pass through a first side surface of the frame, and is mounted on the frame such that a portion of an upper surface or a lower surface of the optical substrate contacts the support part.

20 Claims, 14 Drawing Sheets

BEAM PROJECTOR MODULE FOR SLIDING INSERTION OF AN OPTICAL DEVICE

CROSS REFERENCE TO RELATED APPLICATION

This application claims priority from Korean Patent Application No. 10-2018-0111279, filed on Sep. 18, 2018 and Korean Application No. 10-2019-0104395, filed Aug. 26, 2019, which are both hereby incorporated by reference for all purposes as if fully set forth herein.

BACKGROUND OF THE INVENTION

Field of the invention

The present disclosure relates to a beam projector module.

Description of the Prior Art

Laser is an abbreviation of 'light amplification by stimulated emission of radiation' and may intensively output light. The laser may have a single color and an orientation, and is variously utilized in the optical sensor technical field due to the characteristics.

For example, the laser may be utilized as a light source of a distance measuring device, and may be utilized as a light source of a 3D depth camera. The distance measuring device of a time of flight (ToF) scheme can extract distance information by measuring a movement distance of light waves in the form of pulses output from a light source, which are reflected by an object and returns to the original location through a phase difference, measuring a distance through information on the phase difference and the frequencies, and forming a regular or irregular pattern through a diffuser while a laser light source of a structure light or hybrid stereo type is used as a source.

The laser is utilized for measurement of a distance and as a light source of the 3D depth camera due to the output and orientation characteristics.

Meanwhile, the high-output characteristics of the laser may be recognized as an advantage in that they increases the flight distance of the light and maintains the output of the returning light at a predetermined level or more, but also may be recognized as a disadvantage in the aspect of safety. When the light of a high output is directly irradiated to an eyeball of a person, it may damage the eyeball and may cause loss of eyesight in an extreme case. Accordingly, when the laser is used as a light source, a safety aspect has to be always considered.

In general, in many nations, the intensity of light output from a device is adjusted to a reference value or less in the reference of eye safety.

One of the methods for adjusting the intensity of the output light is to dispose a diffuser that can reduce the intensity of light on the output path of the light. This is because the diffuser disperses condensed light in a field of view (FOV) required in a system as an effect of refraction and diffraction by using the attributes of the light, the intensity per unit area of the light that passed through the diffuser decreases.

However, when the diffuser is detached from the device for adjusting the intensity of light by using the diffuser, the light of a high output is output as it is, which may cause a safety problem.

SUMMARY OF THE INVENTION

The present disclosure provides a technology for a beam projector module that provides an eye-safety function.

According to an aspect of the present disclosure, a beam projector module includes a light source configured to output light, a substrate configured to support the light source, an optical device configured to decrease the intensity of the light output to a predetermined space, an optical substrate, in which the optical device is disposed, and configured to transmit the light, and a frame configured to space the optical device apart from the light source by a predetermined distance, and including a support part configured to support the optical substrate, wherein the optical substrate is slidingly inserted through a first slot formed to pass through a first side surface of the frame, and is mounted on the frame such that a portion of an upper surface or a lower surface of the optical substrate is in contact with the support part.

In the beam projector module, a second slot may be formed in an inner side of a second side surface of the frame, that opposes the first side surface, and a corner of one side of the optical device, which is introduced through the first slot, may be inserted into the second slot.

In the beam projector module, a second slot may be formed in an inner side of a second side surface of the frame, that opposes the first side surface, the optical device may include a plurality of areas having different optical characteristics, and the areas of the optical device having different optical characteristics may be disposed above the light source as the optical substrate slides through the first slot and the second slot.

In the beam projector module, the first slot may be closed by a sealing member.

In the beam projector module, a portion of the outer side of the first slot and a portion of the outer side of the first side surface of the frame may be additionally closed by the sealing member.

In the beam projector module, the second slot may be formed to pass through the second side surface, and the first slot and the second slot may be closed by sealing member, respectively.

In the beam projector module, a third slot may be formed in the frame to pass through a third side surface between the first side surface and the second side surface, and the third slot may be closed by a sealing member.

In the beam projector module, curved convexo-concave portions may be formed on one surface of a portion of the optical substrate, which is inserted into the second slot.

In the beam projector module, a wrinkled part may be formed on one surface of the second slot to correspond to the curved convexo-concave portions.

In the beam projector module, the light source may include a vertical-cavity surface-emitting laser (VCSEL), and the optical device may include a diffuser configured to diffuse the light.

According to another aspect of the present disclosure, a beam projector module includes a light source configured to output light, a substrate configured to support the light source, an optical device configured to decrease the intensity of the light output to a predetermined space, an optical substrate, in which the optical device is disposed, and configured to transmit the light, a frame including a first frame part configured to space the optical device apart from the light source by a predetermined distance, and a second frame part connected to the first frame part through a bonding part including a conductive material, and including a support part configured to support the optical substrate, a sensor electrically connected to the conductive bonding part and configured to measure the resistance value of the bonding part, and a processor configured to operate the light source in an eye-safety mode when the resistance value is a predetermined resistance value or more, wherein a portion of an upper surface or a lower surface of the optical substrate is mounted on the frame to be in contact with the support part.

In the beam projector module, the conductive material may be a conductive epoxy.

In the beam projector module, the light source may include a vertical-cavity surface-emitting laser (VCSEL), and the optical device may include a diffuser configured to diffuse the light.

In the beam projector module, the second frame part may include a socket disposed on a second bonding surface, on which the second frame part and the bonding part are in contact with each other, and the first frame part may include a structure corresponding to the socket, on a first bonding surface, on which the first frame part and the bonding part are in contact with each other.

In the beam projector module, the second frame part may include one or more sockets on the second bonding surface.

In the beam projector module, the first frame part may include wiring lines, on a first bonding surface, on which the first frame part and the bonding part are in contact with each other, and the second frame part may include wiring lines, on a second bonding surface, on which the second frame part and the bonding part are in contact with each other.

In the beam projector module, the sensor may be electrically connected to the bonding part through a via fill disposed in the interior of the first frame part.

In the beam projector module, the support part may extend toward the inside of the frame by a predetermined length according to a preset angle of view.

In the beam projector module, the optical substrate may be slidingly inserted through a first slot formed to pass through a first side surface of the second frame, and may be mounted on the second frame such that a portion of an upper surface or a lower surface of the optical substrate is in contact with the support part.

In the beam projector module, the first bonding surface and the second bonding surface may include curved convexo-concave portions.

In the beam projector module, the processor may operate the light source in an eyes-safety mode when a change rate of the resistance value is measured and the change rate is a predetermined rate or more.

As described above, according to the embodiment, the eyes of the user can be safely protected even though a defect is generated in the beam projector module.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
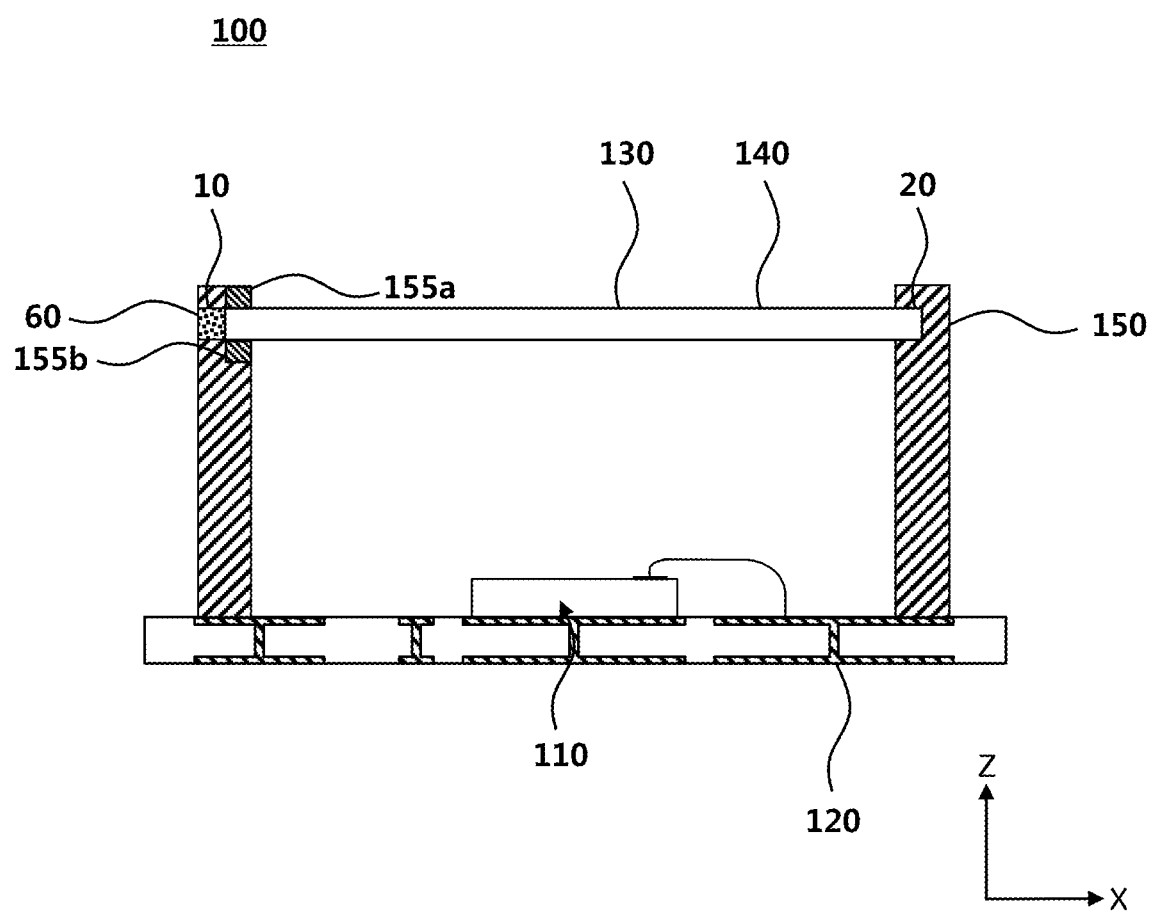
FIG. 1 is a horizontal cross-sectional view of a beam projector module according to a first embodiment.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a horizontal cross-sectional view of a beam projector module according to a first embodiment.

Referring to FIG. 1, the beam projector module 100 according to the first embodiment may include a light source 110, a substrate 120, an optical device 130, an optical substrate 140, and a frame 150.

The light source 110 may be disposed on the substrate 120, and may output light. An anode electrode of the light source 110 may be connected to an anode wiring line of the substrate 120, and a cathode electrode of the light source 110 may be connected to a cathode wiring line of the substrate 120.

The light source 110 may be connected to and disposed on the substrate 120 in a wiring line bonding form. The light source 110 may be disposed on the substrate 120 in a flip chip bonding scheme without a wire. When the light source 110 is connected to the substrate 120 through flip chip bonding, a wiring line is not necessary, and accordingly, a beam projector module of a smaller size can be constituted.

The light source 110 may be any light source, such as a laser, which may output light without limitation, but the light source 110 may include a vertical-cavity surface-emitting laser (VCSEL).

The substrate 120 may support the light source 110. A wiring line 120 may be patterned in the substrate 120. The substrate 120 may be supplied with electric power from the outside, and the electric power may be supplied to the light source 110 through the wiring lines.

The optical device 130 may decrease the intensity of light output from the light source 110 to a predetermined space. For example, the optical device 130 widens an area which light reaches by diffusing the light, and accordingly, the intensity of the light supplied to a unit area can be reduced.

The optical device 130 may be disposed on the optical substrate 140. The optical device 130 may be any device that decreases the intensity of light by diffusing the light without limitation, and may include a diffuser, a diffraction optical element (DOE), or a combination thereof.

The optical substrate 140 may include a plurality of optical substrates. For example, the optical substrate 140 may include a first optical substrate and a second optical substrate. The first optical substrate and the second optical substrate may be disposed while defining a spaced space therebetween. The optical device 130 may be attached to the first optical substrate or the second optical substrate in the spaced space.

Although FIG. 1 illustrates that the optical device 130 is disposed on the optical substrate 140, the optical device 130 may be disposed to be directly supported by the frame 150 without an optical substrate 140 while the optical device 130 is not disposed on the optical device 140. For example, the diffuser or the diffraction optical element (DOE) may be directly disposed in the frame 150. Accordingly, the beam projector module 100 may not include the optical substrate 140.

The frame 150 may be disposed on the substrate 120, and may space the optical device 130 apart from the light source 110 by a predetermined distance. Insertion slots 10 and 20 may be disposed in the frame 150. The frame may support the optical device 130 when the beam projector module 100 does not include the optical substrate 140, and may support the optical device 130 or the optical substrate 140 when the beam projector module 100 includes the optical substrate 140. In this case, the optical device 130 and the optical substrate 140 may be supported at the same time.

The insertion slot 10 may be disposed on the first side surface 1 of the frame 150 such that the insertion slot 10 passes through the first side surface 1 of the frame 150. The width and thickness of the insertion slot 10 of the first side surface 1 may be substantially the same as the width and thickness of the optical device 130 and/or the optical substrate 140. The optical device 130 and/or the optical substrate 140 may be inserted into the insertion slot 10 in a sliding scheme.

The insertion slot 20 may be disposed inside the second side surface 2 of the frame 150. The insertion slot 20 of the second side surface 2 may have a shape that is recessed from a surface of the frame 150 instead of a through-shape. The optical device 130 may be fixed after being slid to the insertion slot 20 of the second side surface 2.

After the optical device 130 and/or the optical substrate 140 is inserted while being slid to the frame 150 and is disposed at a predetermined location, the insertion slot 10 may be closed by a sealing member 60. A portion of the outer side of the insertion slot 10 and a portion of the outer side of the first surface 1 of the frame 150 may be additionally closed by the sealing member 60.

The above may be closed by the sealing member 60 while the location of the optical device 130 and/or the optical substrate 140 is adjusted, in order to precisely align the optical device 130 in the above-described process in which the optical device 130 and/or the optical substrate 140 is fixed to the frame 150 after being slid and inserted. For example, in order to effectively disperse the light output from the light source 110, the location of the optical device 130 or a relative alignment of the optical device 130 with the light source 110 may be important. Accordingly, the location of the optical device 130 may be precisely adjusted in the 'X' direction illustrated in FIG. 1 by minutely adjusting the degree by which the optical device 130 is inserted while being slid, and the optical device 130 and/or the optical substrate 140 may be finally fixed through the sealing member 60 after the optical device 130 is located at a precise location.

The optical device 130 and/or the optical substrate 140 may be finally fixed by the sealing member 60. The sealing member 60 may be any material that can finish the insertion slot 10 with a bonding property without limitation, and may include an ultraviolet curing epoxy resin, a thermosetting epoxy resin, or a combination thereof. Accordingly, after the location of the optical device 130 is precisely adjusted, the location of the optical device 130 may be finally fixed through a curing process.

The frame 150 may include support parts 155a and 155b that support the optical device 130 and/or the optical substrate 140. The optical device 130 and/or the optical substrate 140 may be slidingly inserted through the insertion slot 10, and may be mounted on the frame 150 such that a portion of the upper surface or the lower surface of the optical device 130 and/or the optical substrate 140 is in contact with the support parts 155a and 155b. In detail, a portion of the optical device 130 and/or the optical substrate 140 may be slidingly inserted to be in contact with the upper support part 155a and the lower support part 155b of the frame 150, and the optical device 130 and/or the optical substrate 140 may be supported by the upper support part 155a and the lower support part 155b.

In the conventional beam projector module, the possibility of an optical device (or an optical substrate in which an optical device is disposed) being detached by an external force is high because the optical device is attached to an upper surface of the frame. However, in the beam projector module according to the embodiment of the present disclosure, the possibility of the optical device being detached can be reduced because the optical device 130 and/or the optical substrate 140 is mounted in a sliding manner through the first side surface 1 of the frame 150 and is supported by the support parts 155a and 155b. In detail, because the conventional beam projector module has a small number of units that can fix the optical device with respect to the movement of the optical device in the 'Z' direction of FIG. 1, the possibility of the optical device being detached in the 'Z' direction is high. However, in the beam projector module according to the embodiment of the present disclosure, because the movement of the optical device 130 and/or the optical substrate 140 can be suppressed by the upper support 155a of the frame 150, in which the insertion slots 10 and 20 are disposed, and the movement in the corresponding direction can be fixed when the optical device 130 and/or the optical substrate 140 moves in the 'Z' direction, the possibility of the optical device 130 and/or the optical substrate 140 being detached can be remarkably reduced.

Figure 2:
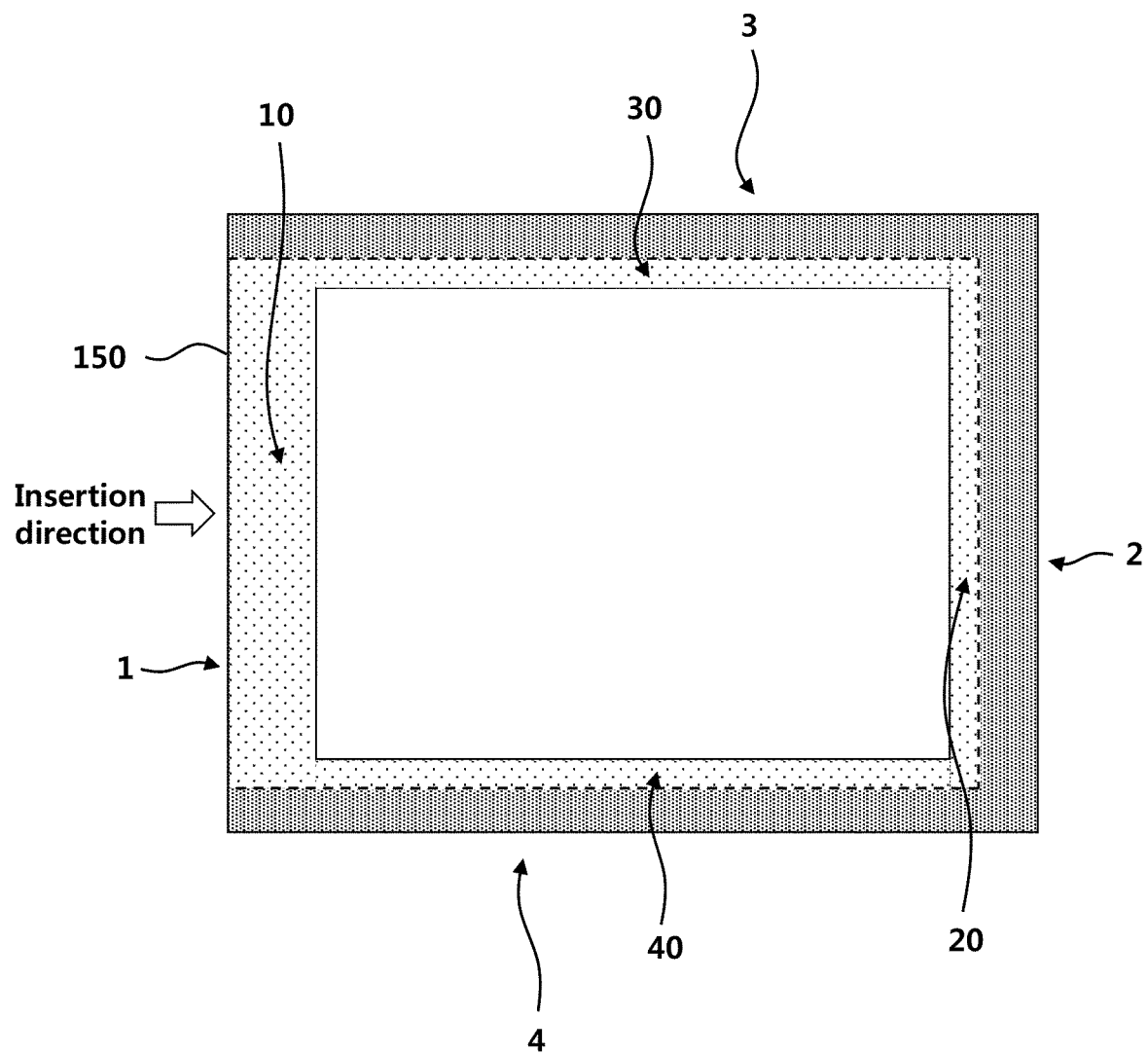
FIG. 2 is a cross-sectional view of a frame according to the first embodiment.

FIG. 2 is a cross-sectional view of a frame according to the first embodiment.

Referring to FIG. 2, the frame 150 may include a first slot 10, a second slot 20, a third slot 30, and a fourth slot 40.

The first slot 10 may be formed in the frame 150 such that the optical device 130 and/or the optical substrate 140 passes through the first side surface 1 of the frame 150 in the insertion direction, and the second slot 20 may be formed in an inner side of the second side surface 2 of the frame 150, that opposes the first side surface 1. The third slot 30 and the fourth slot 40 may be formed on the side surfaces that connect the first side surface 1 and the second side surface 2.

The widths and thicknesses of the first slot 10, the second slot 20, the third slot 30, and the fourth slot 40 may be substantially the same as the width and thickness of the optical device 130 and/or the optical substrate 140. Accordingly, the frame 150 can stably support the optical device 130 and/or the optical substrate 140 after the optical device 130 and/or the optical substrate 140 is slidigly inserted.

Figure 3:
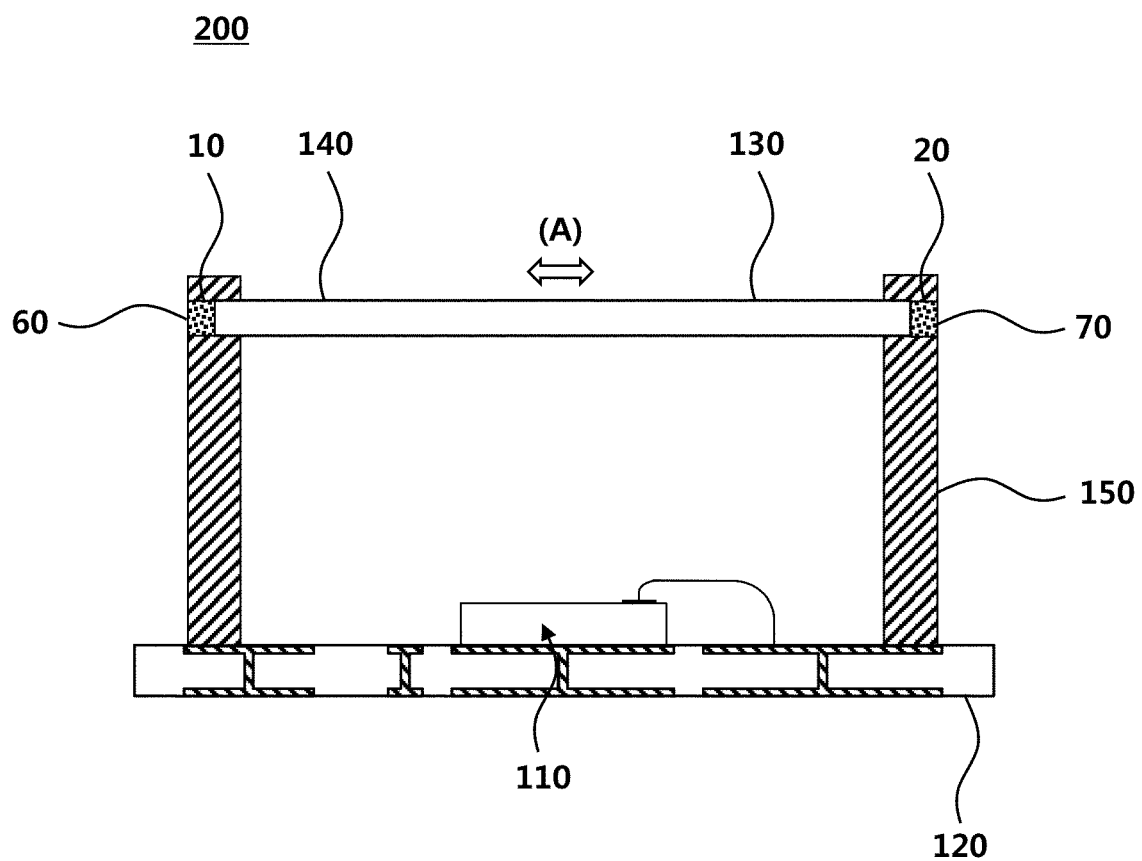
FIG. 3 is a cross-sectional view of a beam projector module according to a second embodiment.

FIG. 3 is a cross-sectional view of a beam projector module according to a second embodiment.

Figure 4:
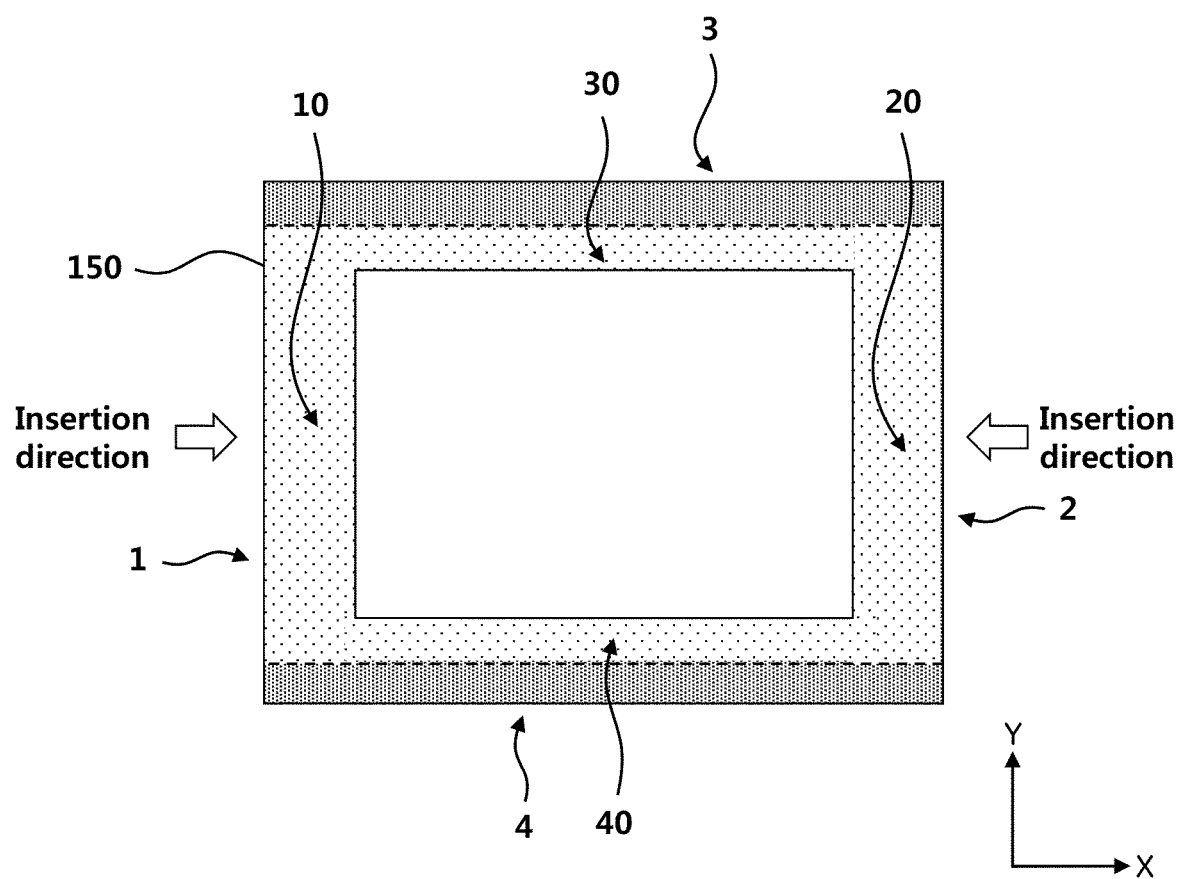
FIG. 4 is a cross-sectional view of a frame according to the second embodiment.

FIG. 4 is a cross-sectional view of a frame according to the second embodiment.

Referring to FIGS. 3 and 4, the beam projector module 200 according to the second embodiment may include a light source 110, a substrate 120, an optical device 130, an optical substrate 140, and a frame 150. The second slot 20 may be formed to pass through the second side surface 2 of the frame, and the first slot 10 and the second slot 20 may be closed by the sealing member.

Because the second slot 20 is formed to pass through the second side surface 2 of the frame, the optical device 130 and/or the optical substrate 140 may be slidingly inserted through the first slot 10 or the second slot 20. That is, the optical device 130 and/or the optical substrate 140 may be inserted through both the first side surface 1 and the second side surface 2 of the frame or may selectively pass through the first side surface 1 and the second side surface 2 to be fixed such that the sealing member may be applied only to one direction. Accordingly, the process for the beam projector module may become more flexible.

As an additional example, the optical device may include a plurality of optical design areas having different optical characteristics, and accordingly, a beam projector module having different optical characteristics can be realized by changing only the location of the optical device while using the same light source.

For example, in the opitcal device and the optical substrate, the optical substrate including an optical device having a specific area including a diffuser used in a TOF scheme having an excellent long distance precision and another area including a structure light pattern used in a structure light (SL) scheme having an excellent short distance precision may not be fixed to the frame, but may be disposed to pass through both the first side surface and the second side surface. Accordingly, through selection of a user or an algorithm of a processor, when a target object is located at a short distance, the other area of the optical device including a structure light pattern is located above the light source such that the beam projector module can output light in a structure light scheme, and when the target object is located at a long distance, the specific area of the optical device including a diffuser is located above the light source such that the beam projector module can output light in a TOF scheme. Accordingly, the precision of the beam projector module can be improved by sliding the optical device and the optical substrate according to the distance of the target object. Further, it is possible to output light having various optical characteristics only through the sliding of the optical substrate.

Because the second slot 20 is formed to pass through the second side surface 2 of the frame, the optical device 130 can be located more easily and precisely after the optical device 130 is slidingly inserted. In detail, because the location of the optical device 130 can be adjusted in the first side surface 1 and the second side surface 2 at the same time after the optical device 130 is slidingly inserted into the frame 150, it can become easier to dispose the optical device 130 at a precise location.

Although not illustrated in FIGS. 3 and 4, the third slot 30 or the fourth slot 40 may be formed to pass through the third side surface 3 or the fourth side surface 4 between the first side surface 1 and the second side surface 2 of the frame. That is, the third slot 30 or the fourth slot 40 may be formed to pass through the first side surface 1, the second side surface 2 that is opposite to the first side surface 1, and the third side surface 3 or the fourth side surface 4 between the first side surface 1 and the second side surface 2 of the frame.

When the third slot 30 or the fourth slot 40 is formed to pass through the third side surface 3 or the fourth side surface 4, it may be more effective to adjust the location of the optical device 130 in the beam projector module manufacturing process. In detail, when the first slot 10 and the second slot 20 are formed to pass through the first side surface 1 and the second side surface 2 of the frame 150 as illustrated in FIG. 4, it is possible to adjust the location of the optical device only in the 'X' direction. However, when the first slot 10 and the second slot 20 pass through the third side surface 3 or the fourth side surface 4, it is also possible to adjust the location of the optical device 130 in the 'Y' direction, and thus it can become easier to precisely adjust the location of the optical device 130.

Figure 5:
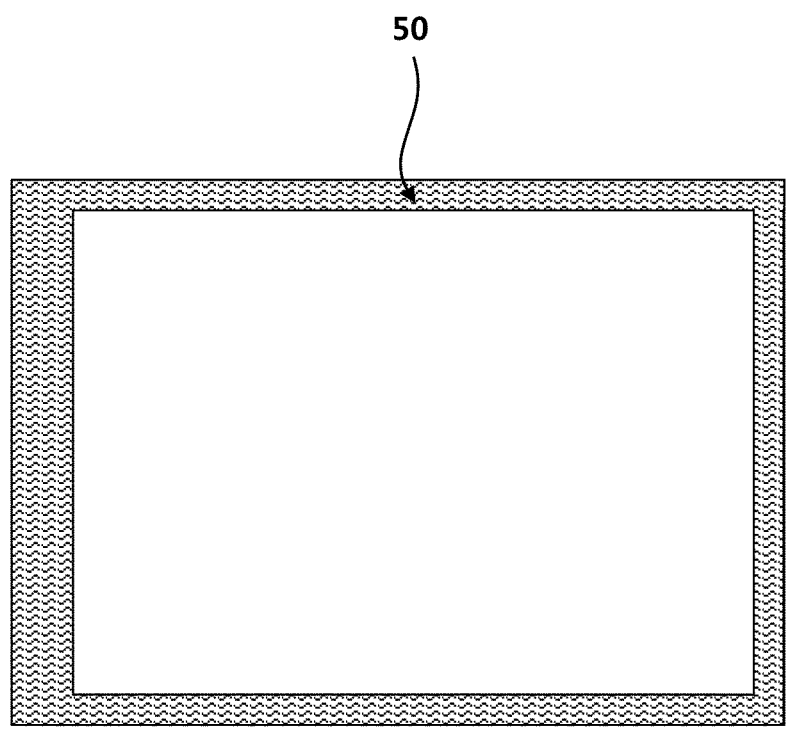
FIG. 5 is a cross-sectional view of a frame according to an embodiment of the present disclosure.

FIG. 5 is a cross-sectional view of a frame according to an embodiment of the present disclosure.

Figure 6:
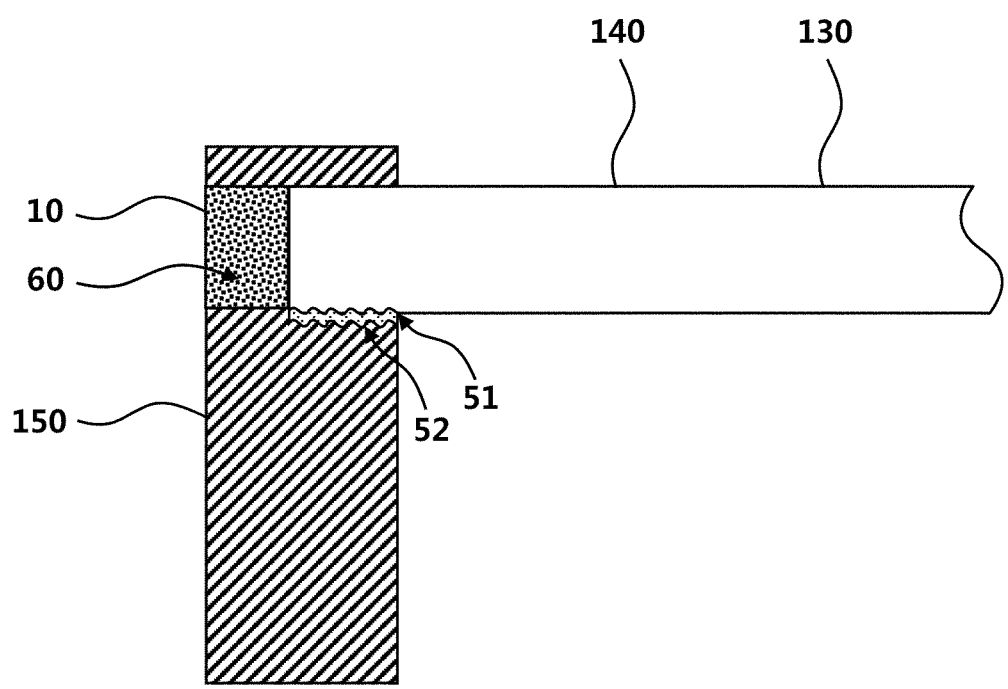
FIG. 6 is a cross-sectional view of a frame according to an embodiment of the present disclosure.

FIG. 6 is a cross-sectional view of a frame according to an embodiment of the present disclosure.

Referring to FIGS. 5 and 6, a wrinkled part 51 may be formed on the optical substrate 140. Curved convexo-concave portions may be formed in the wrinkled part 51. The curved convexo-concave portions also may be disposed in the insertion slots 10, 20, 30, and 40. For example, the curved convexo-concave portions 52 may be formed on surfaces of the first slot 10, the second slot 20, the third slot 30, and the fourth slot 40 to correspond to the curved convexo-concave shape of the wrinkled part 51 of the optical substrate 140.

A fixing force between the optical device 130 and/or the optical substrate 140 and the frame 150 may be reinforced by the wrinkled part 51 and the curved convexo-concave portions 52 corresponding thereto. When the optical device 130 or the optical substrate 140 is slidingly inserted into the frame 150 in the process of manufacturing the beam projector module, it can become easier to dispose the optical device 130 at a proper location through the wrinkled part 51 and the convexo-concave portions 52 having a suitable fixing force.

Figure 7:
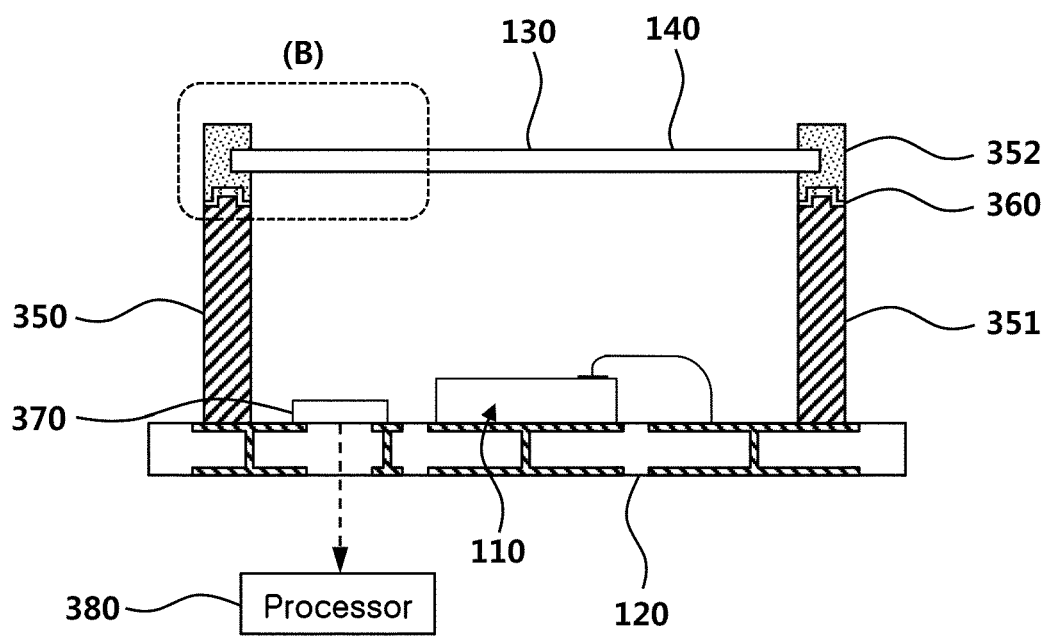
FIG. 7 is a cross-sectional view of a beam projector module according to a third embodiment.

FIG. 7 is a cross-sectional view of a beam projector module according to a third embodiment.

Referring to FIG. 7, the beam projector module 300 according to the third embodiment may include a light source 110, a substrate 120, an optical device 130, an optical substrate 140, a frame 350, a sensor 370, and a processor 380.

The supply of electric power to the light source 110 may be controlled by the processor 380, and the processor 380 may control the electric power supplied to the light source 110 differently in a normal mode and an eye-safety mode. For example, the processor 380 may supply electric power to the light source 110 only in the normal mode, and may not supply the electric power to the light source 110 in the eye-safety mode. As another example, the processor 380 may supply less electric power to the light source 110 in the eye-safety mode than in the normal mode.

The substrate 120 may support the light source 110. A wiring line may be patterned in the substrate 120. The substrate 120 may be supplied with electric power from the outside, and the electric power may be supplied to the light source 110, the sensor 370, and the processor 380, through the wiring lines.

The frame 350 may include a first frame part 351 and a second frame part 352. The first frame part 351 may space the optical device 130 apart from the light source 110 by a predetermined distance. The second frame part 352 may include a support part (not illustrated) that supports the optical device 130 and/or the optical substrate 140. A portion of the upper surface or the lower surface of the optical device 130 and/or the optical substrate 140 may be mounted on the frame 350 to be in contact with the support part (not illustrated).

The first frame part 351 and the second frame part 352 may be connected to each other through a bonding part 360 including a conductive material. The boding part 360 may include a conductive material, and the conductive material may be any material having a bonding property and a conductive property without limitation.

The sensor 370 may communicate with the processor 380, and may be a resistance sensor that may be electrically connected to the bonding part 360 to measure the resistance value of the bonding part 360.

The processor 380 may change an operation mode of the light source 110 according to the resistance value of the sensor 370. For example, the processor 380 may operate the light source 110 in an eye-safety mode when the resistance value of the sensor 370 is a predetermined resistance value or more. In the eye-safety mode, the processor 380 may interrupt or reduce the electric power supplied to the light source 110.

The processor 380 may cause the light source 110 to output the wavelength of the eye-safety free band in the eye-safety mode. For example, the wavelength of the eye-safety free band may be 1050 nm.

Figure 8:
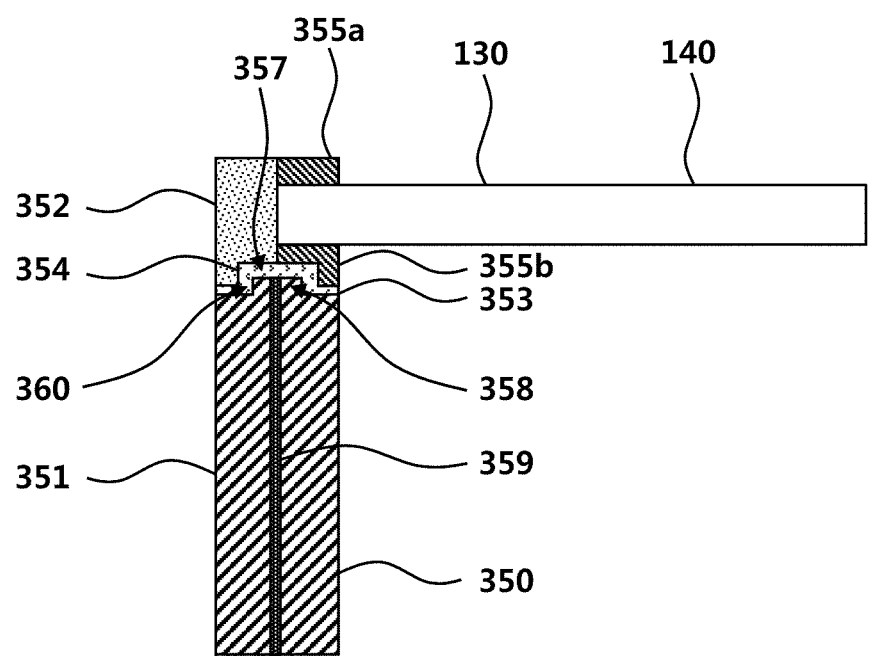
FIG. 8 is an enlarged view of portion B of FIG. 7.

FIG. 8 is an enlarged view of portion B of FIG. 7.

Referring to FIG. 8, the frame 350 may include a first frame part 351 and a second frame part 352, and the first frame part 351 and the second frame part 352 may be connected to each other through a bonding part 360.

The first frame part 351 may be in contact with the bonding part 360 through a first bonding surface 353. Wiring lines may be patterned in a portion or the entire portion of the first bonding surface 353. The second frame part 352 may be in contact with the bonding part 360 through a second bonding surface 354. Wiring lines may be patterned in a portion or the entire portion of the second bonding surface 354. Accordingly, the first frame part 351, the second frame part 352, and the bonding part 360 may be electrically connected to each other through the bonding part 360 including the first bonding surface 353, the second bonding surface 354, and the conductive material. As the first frame part 351, the second frame part 352, and the bonding part 360 are electrically connected to each other, the resistance value of the bonding part 360 may change if the second frame part 352 is spaced apart from the first frame part 351 and the bonding part 360 due to an external impact or the like. A wiring line may not be formed on the first bonding surface 353 and the second bonding surface 354 but may be plated with a metal. Accordingly, through the metal plating, the first bonding surface 353, the second bonding surface 354, and the bonding part 360 may be electrically connected to each other. The metal may be any conductive metal without limitation, and may be copper, gold, nickel, or a combination thereof.

The second frame part 352 may include support parts 355a and 355b. The support parts may include an upper support part 355a and a lower support part 355b, and the upper support part 355a and the lower support part 355b may stably support the optical device 130 and/or the optical substrate 140 on the upper and lower sides.

The optical device 130 and/or the optical substrate 140 may be slidingly inserted through a first slot formed to pass through the first side surface of the second frame 352, and may be mounted on the frame 350 such that a portion of the upper surface or the lower surface of the optical device 130 and/or the optical substrate 140 is in contact with the support parts 355a and 155b.

The second frame part 352 may include a socket 357 disposed on the second bonding surface 354. The first frame 351 may include a convexo-concave structure 358 corresponding to the socket 357, on the first bonding surface 353. The socket 357 and the convexo-concave structure 358 may increase the coupling force between the first frame part 351 and the second frame part 352 when the first frame part 351 and the second frame part 352 are connected to each other through the bonding part 360. For example, as illustrated in FIG. 8, in a case in which the first frame part 351 includes the convexo-concave structure 358 and the second frame part 352 includes the socket 357 corresponding thereto, the socket 357 and the convexo-concave structure 358 can widen the contact area between the first frame part 351 and the second frame part 352 and can restrain the first frame part 351 and the second frame part 352 from being spaced apart from each other through the engagement thereof when the first frame part 351 or the second frame part 352 receives an external impact.

Although FIGS. 7 and 8 illustrate an embodiment in which the first frame part 351 includes the convexo-concave structure and the second frame part 352 includes the socket, the present disclosure is not limited thereto, and the first frame 351 may include the socket and the second frame part 352 may include the convexo-concave structure.

Wiring lines may be formed on the inner and outer sides of the first frame part 351 such that the first frame part 351 is electrically connected to the bonding part 360 including a conductive material. Further, a via fill 359 may be disposed in the interior of the first frame part 351. The sensor 370 and the bonding part 360 may be electrically connected to each other through the wiring lines on the inner and outer sides of the first frame part 351 or the via fill 359.

Accordingly, when the resistance value of the bonding part 360 changes, the sensor 370 may be electrically connected to the bonding part 360 through the first bonding surface 353, the wiring lines formed on the second bonding surface 354 and the wiring lines formed on the inner and outer sides of the first frame part 351, or the via fill 359 to measure the resistance value of the bonding part 360. The via fill 359 may be any electrically conductive material without limitation, and may be copper, gold, nickel, or a combination thereof.

Figure 9A:
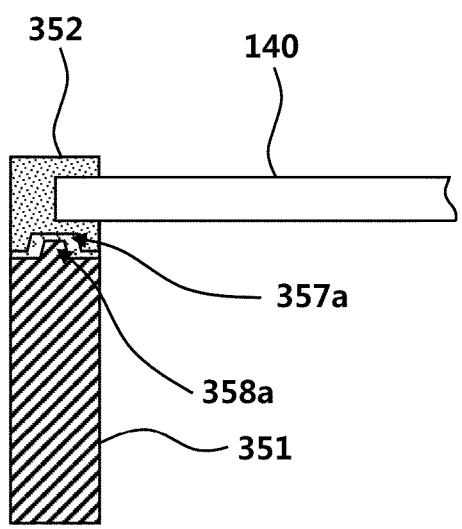
FIGS. 9A and 9B are cross-sectional views illustrating various sockets of a frame according to an embodiment of the present disclosure.
Figure 9B:
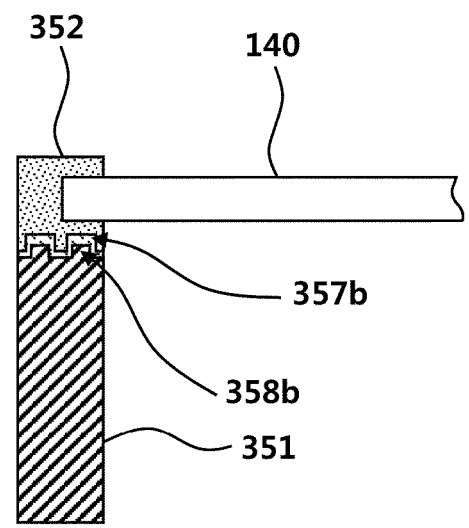

FIGS. 9A and 9B are cross-sectional views illustrating various sockets of a frame according to an embodiment of the present disclosure.

Referring to FIGS. 9A and 9B, the frame 350 of the beam projector module according to the embodiment may include a socket 359 of various structures. For example, the frame 350 may include a socket 357a including not a rectangular structure but an inclined surface, and a convexo-concave structure 358a as illustrated in FIG. 9A, and may include one or more sockets 357b and a convexo-concave 358b in consideration of the coupling force of the first frame part 351 and the second frame part 352 as illustrated in FIG. 9B.

Figure 10:
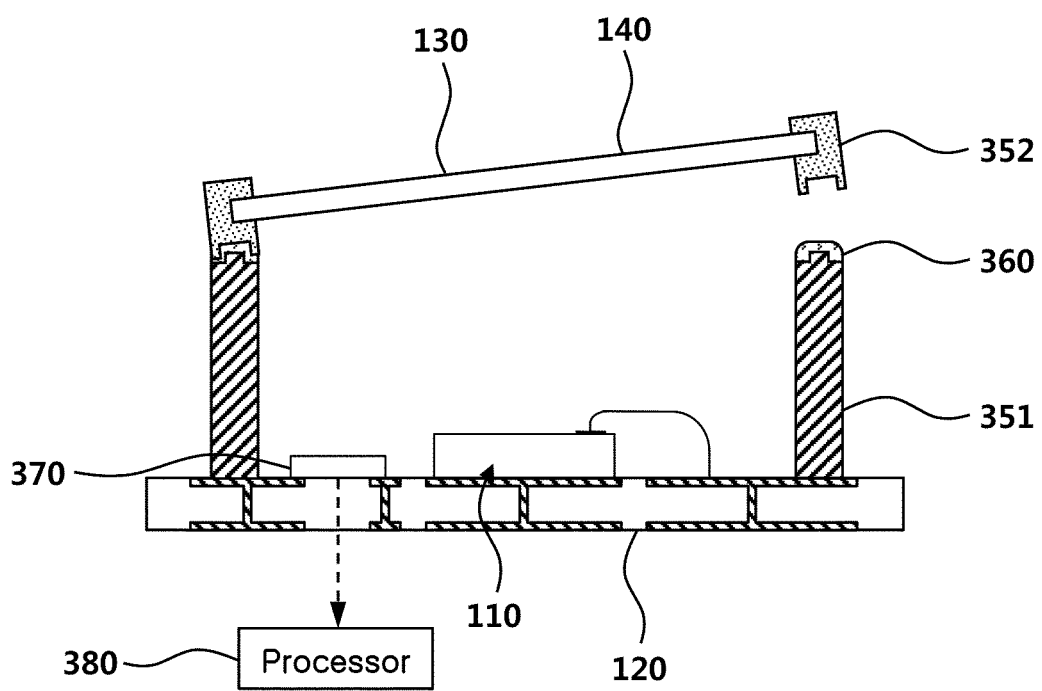
FIG. 10 is a view illustrating a case in which the beam projector module according to the third embodiment has a defect.

FIG. 10 is a view illustrating a case in which the beam projector module according to the third embodiment has a defect.

Referring to FIG. 10, in the beam projector module 300, the first frame part 351 and the second frame part 352 may be spaced apart from each other due to a factor such as an external impact.

If the first frame part 351 and the second frame part 352 are spaced apart from each other, the optical substrate 140, to which the optical device 130 is attached, may deviate from a normal location to be spaced apart from the first frame part 351, and accordingly, light output from the light source 110 may damage an eye of a user while reaching the eye in a state in which the intensity of the light is not decreased.

If the first frame part 351 and the second frame part 352 are physically spaced apart from each other, the first frame part 351 and the second frame part 352 are not electrically connected to each other anymore, and accordingly, the resistance value of the bonding part 360 measured by the sensor 370 increases. Then, the processor 380 may compare the resistance value measured by the sensor and a predetermined resistance value. For example, the processor 380 may operate the light source 110 in an eye-safety mode when it is determined that the resistance value measured by the sensor 370 is more than a predetermined resistance value. The processor 380 may operate the light source 110 in an eye-safety mode when the change rate of the resistance value is a predetermined value or more.

That is, the processor 380 may determine whether the optical device 130 is disposed at a normal location according to the resistance value measured in the bonding part 360, and may operate the eye-safety mode. Because the output light can be prevented from reaching the eye of the user as it is even though the optical device 130 deviates from the normal location by stopping the supply of electric power to the light source 110 to no longer output light if the eye-safety mode is operated or to supply less electric power to reduce the intensity of the light during normal driving, the eye of the user can be safely protected.

Figure 11:
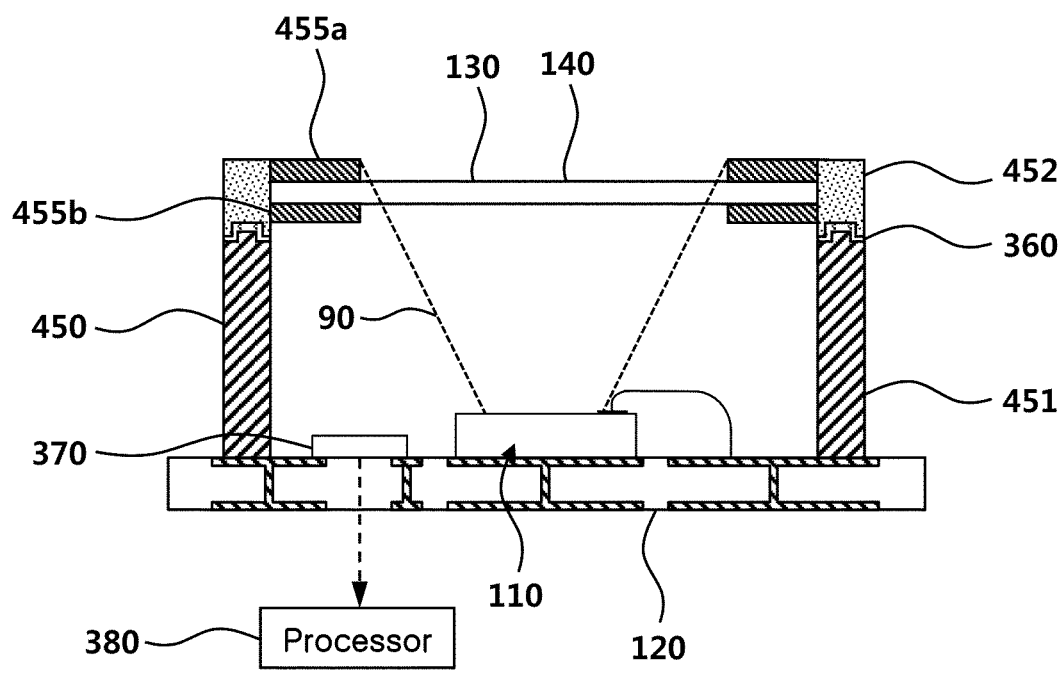
FIG. 11 is a cross-sectional view of a beam projector module according to a fourth embodiment.

FIG. 11 is a cross-sectional view of a beam projector module according to a fourth embodiment.

Figure 12:
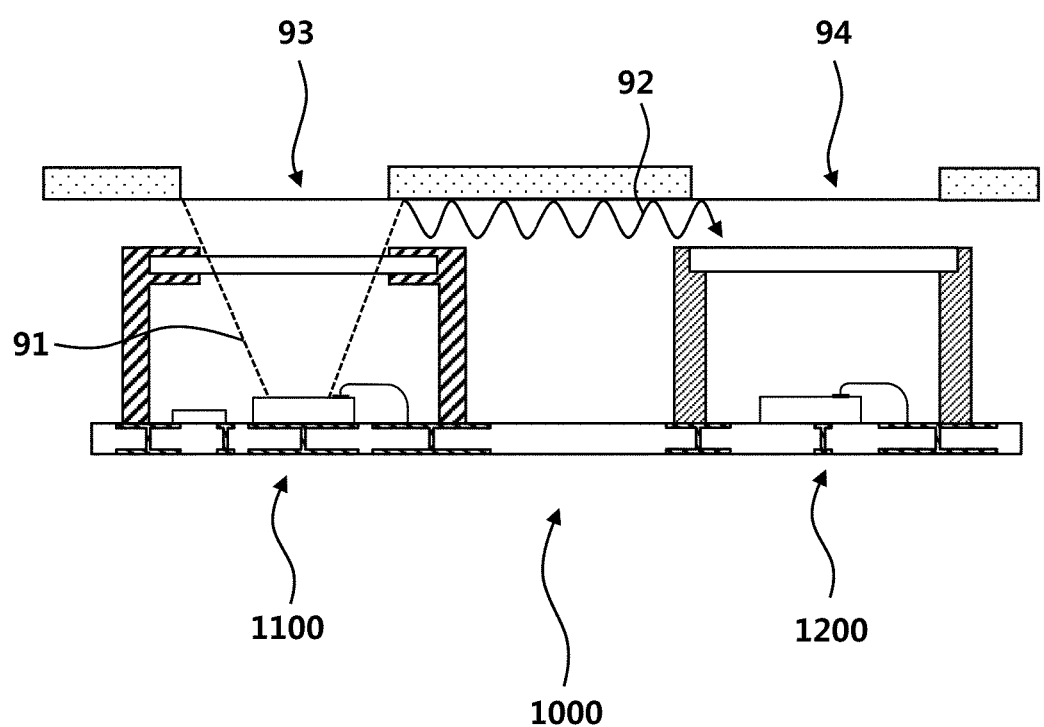
FIG. 12 is a view illustrating an effect according to adjustment of an angle of view of the beam projector module according to the fourth embodiment.

FIG. 12 is a view illustrating an effect according to adjustment of an angle of view of the beam projector module according to the fourth embodiment.

Referring to FIG. 11, the support parts 455a and 455b may extend toward the inside of the frame 450 by a predetermined length to adjust the angle 90 of view of the light source 110 included in the frame 450 of the beam projector module 400.

The support parts 455a and 455b may extend in consideration of the preset angle 90 of view of the beam projector module 400. For example, the angle of view required by the beam projector module may be variously determined according to the characteristics of the light source, or the environment and the use purpose of the device in which in the beam projector module is installed. Then, it is important to precisely output light according to the angle of view required by the beam projector module.

In detail, because the transmission part opening 93 of the device, in which the distance measuring module 1000 is installed, and the angle of view are not properly aligned in the beam projector module 1100 in which the angle of view of the light output is not properly set as illustrated in FIG. 12, a portion of the emitted light 92 may not pass through the transmission part opening 93 or is diffracted around the transmission part opening 93 to reach the reception part 1200 without being reflected by the target object. Because the movement distance of the portion of the light 92 is relatively short as compared with the light reflected by the target object, an error of wrongly measuring the distance of the target by the reception part 1200 may occur due to the portion of the light 92, and accordingly, noise may be caused in the distance measurement result.

Meanwhile, in the beam projector module 400 of FIG. 11, in which the angle of view is properly set, it is possible to minimize a phenomenon in which the light output after the angle of view is properly aligned according to the transmission part opening of the device differently installed from the beam projector module of FIG. 12 does not pass through the transmission part opening or is diffracted. As a result, the error and noise of the distance measurement result can be remarkably reduced.

In this way, it is important to precisely output the light at a preset angle of view in a beam projector module, because the support parts 455a and 455b may extend by a predetermined length in consideration of the angle 90 of view in the beam projector module 400 illustrated in FIG. 11, the light can be precisely output at a preset angle 90 of view. The extension lengths of the support parts 455a and 455b may be differently adjusted according to preset angles of view of the beam projectors.

It is illustrated that both the upper support part 455a and the lower support part 455b of FIG. 11 extend, but only the lower support part 455b may extend or only the upper support part 455a may extend. The extension lengths of the upper support part 455a and the lower support part 455b may be different.

Because the support parts 455a and 455b extend, the areas, by which the support parts 455a and 455b support the optical device 130 and/or the optical substrate 140, may become larger, and accordingly, the optical device 130 and/or the optical substrate 140 can be more effectively prevented from being detached.

Figure 13:
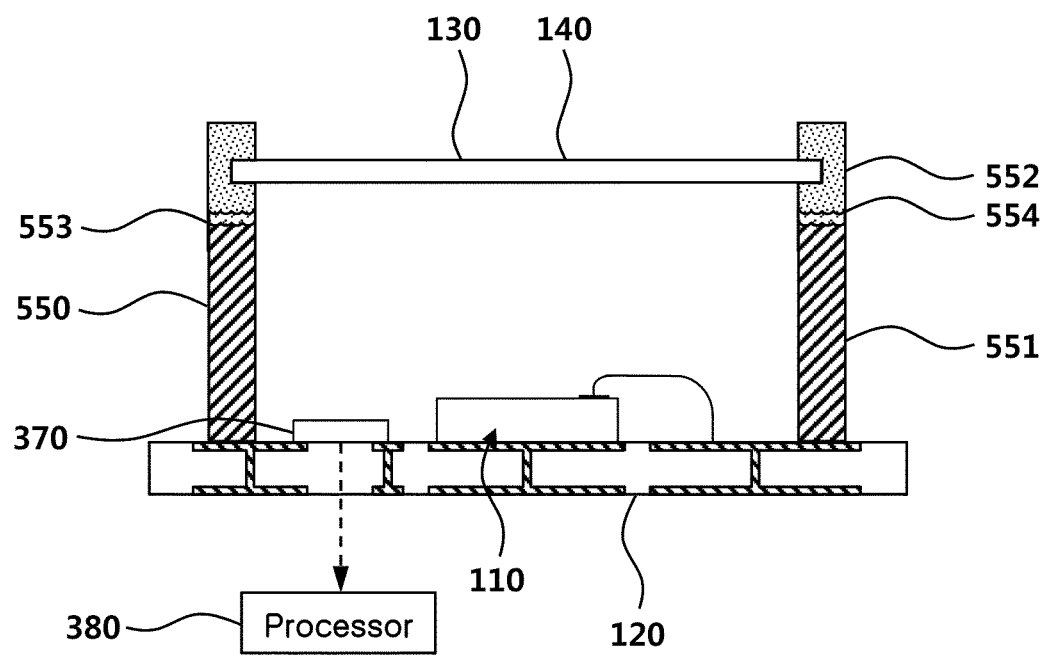
FIG. 13 is a cross-sectional view of a beam projector module according to a fifth embodiment.

FIG. 13 is a cross-sectional view of a beam projector module according to a fifth embodiment.

Referring to FIG. 13, the first bonding surface and the second bonding surface of the frame 550 may include curved convexo-concave portions.

Accordingly, because the bonding part includes curved convex-concave portions and the surface area of a portion of the bonding part, which is bonded to the first frame part 551 and the second frame part 552, can become larger, the bonding force between the first frame part 551 and the second frame part 552 can be increased such that the first frame part 551 and the second frame part 552 can be connected to each other more firmly.

Figure 14:
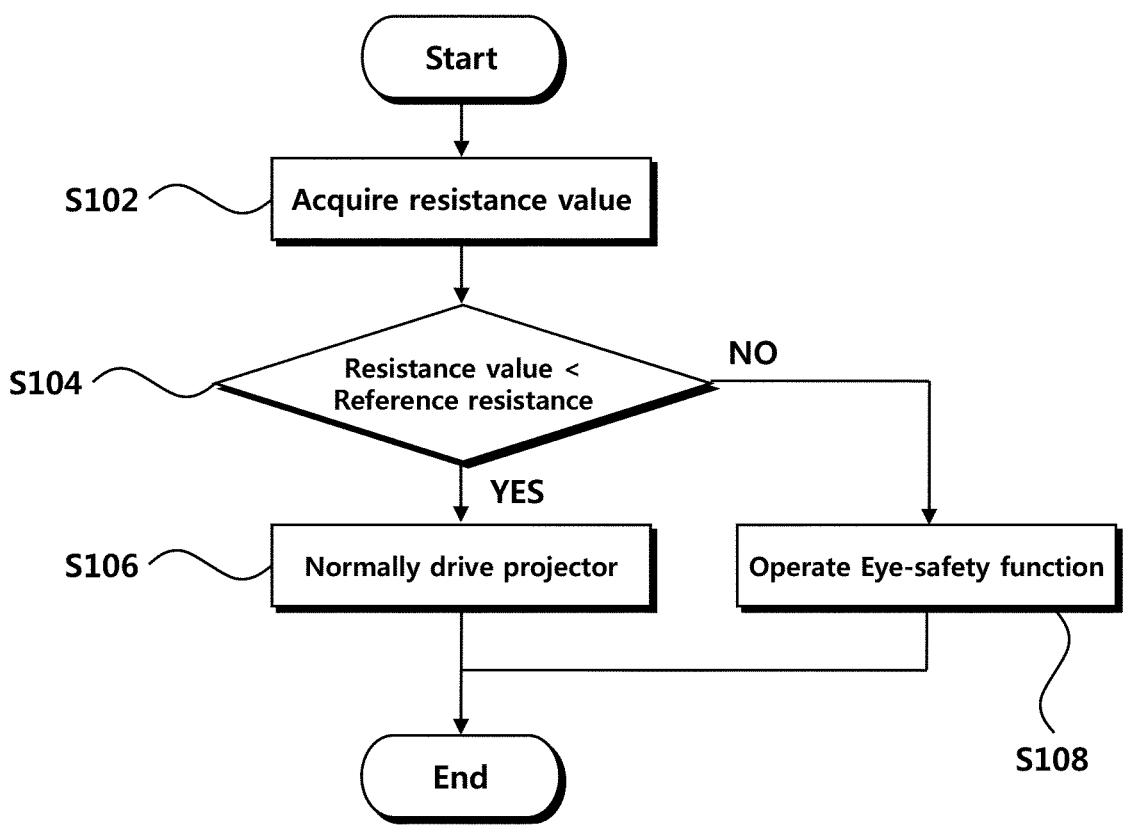
FIG. 14 is a flowchart of a method for changing an operation mode according to a resistance value by a beam projector module according to an embodiment of the present disclosure.

FIG. 14 is a flowchart of a method for changing an operation mode according to a resistance value by a beam projector module according to an embodiment of the present disclosure.

Referring to FIG. 14, the processor may acquire the resistance value from the sensor (S102). The resistance value may be a resistance value measured in the bonding part.

The processor may determine whether the measured resistance value is a value that is smaller than a reference resistance value (S104). The processor may measure a change rate of the resistance value and determine whether the resistance value increases at a predetermined rate or more.

The processor may drive the light source in a normal mode if the resistance value is smaller than the reference resistance value (S106). The processor may drive the light source in an eye-safety mode if the resistance value is larger than the reference resistance value (S108). In the eye-safety mode, the processor may turn off the light source or may reduce the supply of electric power to the light source.

As described above, according to the embodiment, the eyes of the user can be safely protected even though a defect is generated in the beam projector module.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A beam projector module comprising:
a light source configured to output light;
a substrate configured to support the light source;
an optical device configured to decrease the intensity of the light output to a predetermined space;
an optical substrate, on which the optical device is disposed, and configured to transmit the light; and
a frame configured to space the optical device apart from the light source by a predetermined distance, and including a support part configured to support the optical substrate,
wherein the optical substrate is slidingly inserted through a first slot formed as an elongate borehole passing through a first side surface of the frame, wherein the first side surface is oriented generally transverse to the substrate, and is mounted on the frame such that a portion of an upper surface or a lower surface of the optical substrate is in contact with the support part.

2. The beam projector module of claim 1, wherein a second slot is formed in an inner side of a second side surface of the frame, which opposes the first side surface, and a corner of one side of the optical device, which is introduced through the first slot, is inserted into the second slot.

3. The beam projector module of claim 1, wherein the first slot is closed by a sealing member.

4. The beam projector module of claim 1, wherein a second slot is formed in an inner side of a second side surface of the frame, which opposes the first side surface, the optical device comprises a plurality of areas having different optical characteristics, and the areas of the optical device having different optical characteristics are disposed above the light source as the optical substrate slides through the first slot and the second slot.

5. The beam projector module of claim 2, wherein the second slot is formed to pass through the second side surface, and the first slot and the second slot are respectively closed by sealing member.

6. The beam projector module of claim 2, wherein a third slot is formed to pass through a third side surface between the first side surface and the second side surface of the frame, and the third slot is closed by a sealing member.

7. The beam projector module of claim 2, wherein curved convexo-concave portions are disposed on one surface of a portion of the optical substrate, which is inserted into the second slot.

8. The beam projector module of claim 7, wherein one surface of the second slot comprises a wrinkled part corresponding to the curved convexo-concave portions.

9. The beam projector module of claim 1, wherein the light source comprises a vertical-cavity surface-emitting laser (VCSEL), and the optical device comprises a diffuser configured to diffuse the light.

10. A beam projector module comprising:
a light source configured to output light;
a substrate configured to support the light source;
an optical device configured to decrease the intensity of the light output to a predetermined space;
an optical substrate, on which the optical device is disposed, and configured to transmit the light;
a frame comprising: a first frame part configured to space the optical device apart from the light source by a predetermined distance; and a second frame part connected to the first frame part through a bonding part comprising a conductive material, and comprising a support part configured to support the optical substrate;
a sensor electrically connected to the bonding part and configured to measure the resistance value of the bonding part; and
a processor configured to operate the light source in an eye-safety mode when the resistance value is a predetermined resistance value or more,
wherein a portion of an upper surface or a lower surface of the optical substrate is mounted on the frame to be in contact with the support part.

11. The beam projector module of claim 10, wherein the conductive material is a conductive epoxy.

12. The beam projector module of claim 10, wherein the light source comprises a vertical-cavity surface-emitting laser (VCSEL), and the optical device comprises a diffuser configured to diffuse the light.

13. The beam projector module of claim 10, wherein the second frame part comprises a socket disposed on a second bonding surface, on which the second frame part and the bonding part are in contact with each other, and the first frame part comprises a structure corresponding to the socket, on a first bonding surface, on which the first frame part and the bonding part are in contact with each other.

14. The beam projector module of claim 13, wherein the second frame part comprises one or more sockets on the second bonding surface.

15. The beam projector module of claim 10, wherein the first frame part comprises wiring lines, on a first bonding surface, on which the first frame part and the bonding part are in contact with each other, and the second frame part comprises wiring lines, on a second bonding surface, on which the second frame part and the bonding part are in contact with each other.

16. The beam projector module of claim 10, wherein the sensor is electrically connected to the bonding part through a via-fill disposed in the interior of the first frame part.

17. The beam projector module of claim 10, wherein the support part extends toward the inside of the frame by a predetermined length according to a preset angle of view.

18. The beam projector module of claim 10, wherein the optical substrate is slidingly inserted through a first slot formed to pass through a first side surface of the second frame, and is mounted on the second frame such that a portion of an upper surface or a lower surface of the optical substrate is in contact with the support part.

19. The beam projector module of claim 10, wherein the first bonding surface and the second bonding surface comprises curved convexo-concave portions.

20. The beam projector module of claim 10, wherein the processor operates the light source in an eyes-safety mode when a change rate of the resistance value is measured and the change rate is a predetermined rate or more.

* * * * *